(12) United States Patent
Park et al.

(10) Patent No.: US 12,394,641 B2
(45) Date of Patent: Aug. 19, 2025

(54) MOLDING APPARATUS OF SEMICONDUCTOR PACKAGE

(71) Applicant: Samsung Electronics Co., Ltd., Suwon-si (KR)

(72) Inventors: Jinwoo Park, Suwon-si (KR); Myungsung Kang, Suwon-si (KR); Jaekyung Yoo, Suwon-si (KR); Unbyoung Kang, Suwon-si (KR); Chungsun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 251 days.

(21) Appl. No.: 18/134,718

(22) Filed: Apr. 14, 2023

(65) Prior Publication Data

US 2023/0395403 A1    Dec. 7, 2023

(30) Foreign Application Priority Data

Jun. 2, 2022  (KR) .................. 10-2022-0067701
Aug. 10, 2022  (KR) .................. 10-2022-0100158

(51) Int. Cl.
    *H01L 21/67*    (2006.01)
(52) U.S. Cl.
    CPC .............................. *H01L 21/67126* (2013.01)
(58) Field of Classification Search
    None
    See application file for complete search history.

(56) References Cited

U.S. PATENT DOCUMENTS 4,954,301 A  * 9/1990  Saeki ............... H01L 21/67126
                                                    425/166
7,803,660 B2    9/2010  Murakami et al.
(Continued)

FOREIGN PATENT DOCUMENTS

CN          101537453 B  * 12/2010
JP           5352896 B2    11/2013
(Continued)

*Primary Examiner* — Yung-Sheng M Tsui
(74) *Attorney, Agent, or Firm* — Muir Patent Law, PLLC

(57) ABSTRACT

A molding apparatus for a semiconductor package includes a chamber including a lower mold configured to hold a substrate including a plurality of molding targets, an upper mold configured to move up and down with respect to the lower mold and define a cavity between the upper mold and the lower mold, and a port configured to provide a passage communicating with the cavity, a molding material supplier configured to supply a molding material to the port, a plunger configured to pressurize the molding material inside the port, a plunger actuator configured to apply a first pressure to the plunger such that the molding material provided in the port is supplied to the cavity, and a mold actuator configured to control actuation of the upper mold. The plunger actuator is configured to supply the molding material to the cavity by applying the first pressure to the plunger, and the mold actuator is configured to pressurize the molding material in the cavity by applying a second pressure to the upper mold. The mold apparatus further includes a controller configured to control the plunger actuator to reduce the first pressure applied to the plunger after the mold actuator begins applying the second pressure to the upper mold.

20 Claims, 14 Drawing Sheets

(56) References Cited

U.S. PATENT DOCUMENTS

| | | |
|---|---|---|
| 8,105,524 B2 | 1/2012 | Yamada et al. |
| 8,727,757 B2 | 5/2014 | Maekawa et al. |
| 9,738,014 B2 | 8/2017 | Maeyama et al. |
| 9,859,133 B2 | 1/2018 | Kasai et al. |
| 11,217,463 B2 | 1/2022 | Gal et al. |
| 2008/0251949 A1 | 10/2008 | Sin et al. |

FOREIGN PATENT DOCUMENTS

| | | | |
|---|---|---|---|
| JP | 6541746 B2 | 7/2019 | |
| KR | 10-0172188 B1 | 3/1999 | |
| KR | 10-0194361 B1 | 6/1999 | |
| KR | 10-0260993 B1 | 7/2000 | |
| KR | 10-0451382 B1 | 9/2004 | |
| KR | 10-0849181 B1 | 7/2008 | |
| KR | 10-1011863 B1 | 1/2011 | |
| KR | 10-1020612 B1 | 3/2011 | |
| KR | 10-2208014 B1 | 1/2021 | |
| WO | WO-2016203779 A1 * | 12/2016 | ............. B29C 43/18 |

\* cited by examiner

MOLDING APPARATUS OF SEMICONDUCTOR PACKAGE

CROSS-REFERENCE TO RELATED APPLICATIONS

This application is based on and claims priority under 35 U.S.C. § 119 to Korean Patent Application Nos. 10-2022-0067701 filed on Jun. 2, 2022 and 10-2022-0100158 filed on Aug. 10, 2022, in the Korean Intellectual Property Office, the disclosures of which are incorporated by reference herein in their entireties.

BACKGROUND

Aspects of the inventive concept relate to a molding apparatus for a semiconductor package.

In order to prevent damage to a semiconductor chip due to external impact or light, a molding process of molding the semiconductor chip with a sealing resin, such as an epoxy molding compound (EMC), is performed. The recent trend of a semiconductor industry is to continuously achieve small, thin, lightweight, highly integrated and highly dense semiconductor products. Accordingly, the thickness of a semiconductor package is decreasing, and the thickness of the molding resin is also decreasing. As a result, using conventional molding techniques, undesired voids may be present in a completed product such as a semiconductor package. Example embodiments discussed herein address this issue and may help remove or decrease voids formed in a mold layer of a product.

SUMMARY

Aspects of the inventive concept provide a molding apparatus for a semiconductor package with a small thickness, reducing voids in a molding resin, and improving an unfilled molding resin, in relation to the apparatus for molding the semiconductor package.

According to an aspect of the inventive concept, a molding apparatus for a semiconductor package includes a chamber including a lower mold configured to hold a substrate including a plurality of molding targets, an upper mold configured to move up and down with respect to the lower mold and define a cavity between the upper mold and the lower mold, and a port configured to provide a passage communicating with the cavity, a molding material supplier configured to supply a molding material to the port, a plunger configured to pressurize the molding material inside the port, a plunger actuator configured to apply a first pressure to the plunger such that the molding material provided in the port is supplied to the cavity, and a mold actuator configured to control actuation of the upper mold. The plunger actuator is configured to supply the molding material to the cavity by applying the first pressure to the plunger, and the mold actuator is configured to pressurize the molding material in the cavity by applying a second pressure to the upper mold. The mold apparatus further includes a controller configured to control the plunger actuator to reduce the first pressure applied to the plunger after the mold actuator begins applying the second pressure to the upper mold.

According to another aspect of the inventive concept, a molding apparatus for a semiconductor package includes a cylindrical chamber including a lower mold configured to hold a substrate including a plurality of molding targets, and an upper mold configured to move up and down with respect to the lower mold and define a cavity between the upper mold and the lower mold, a first port formed on an inner sidewall of the chamber and configured to provide a passage communicating with the cavity, a second port formed in a top portion of the chamber and configured to provide a passage communicating with the cavity, a molding material supplier configured to supply a molding material to the second port, a plunger configured to pressurize the molding material inside the second port, a plunger actuator configured to apply a first pressure to the plunger such that the molding material provided in the second port is supplied to the cavity, and a mold actuator configured to control actuation of the upper mold. The plunger actuator is configured to supply the molding material to the cavity by applying the first pressure to the plunger, and the mold actuator is configured to pressurize the molding material in the cavity by applying a second pressure to the upper mold.

According to another aspect of the inventive concept, a molding apparatus for a semiconductor package includes a chamber including a lower mold configured to hold a substrate including a plurality of molding targets, and an upper mold configured to move and down with respect to the lower mold and define a cavity between the upper mold and the lower mold, a port formed on a sidewall of the chamber in a first direction, configured to provide a passage communicating with the cavity, and discharge a molding material to the cavity in a second direction perpendicular to the first direction, a molding material supplier configured to supply a molding material to the port, a plunger configured to pressurize the molding material inside the port, a plunger actuator configured to apply a first pressure to the plunger such that the molding material provided in the port is supplied to the cavity, and a mold actuator configured to control actuation of the upper mold. The plunger actuator is configured to supply the molding material to the cavity by applying a first pressure equal to or less than 5 MPa to the plunger, the mold actuator is configured to pressurize the molding material in the cavity by applying a second pressure higher than the first pressure to the upper mold. The molding apparatus further includes a controller configured to control the mold actuator to apply the first pressure to the plunger and apply the second pressure to the upper mold after the molding material molds the plurality of molding targets arranged at a farthest distance from the port, and to control the plunger actuator to reduce the first pressure applied to the plunger after the mold actuator begins applying the second pressure to the upper mold.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
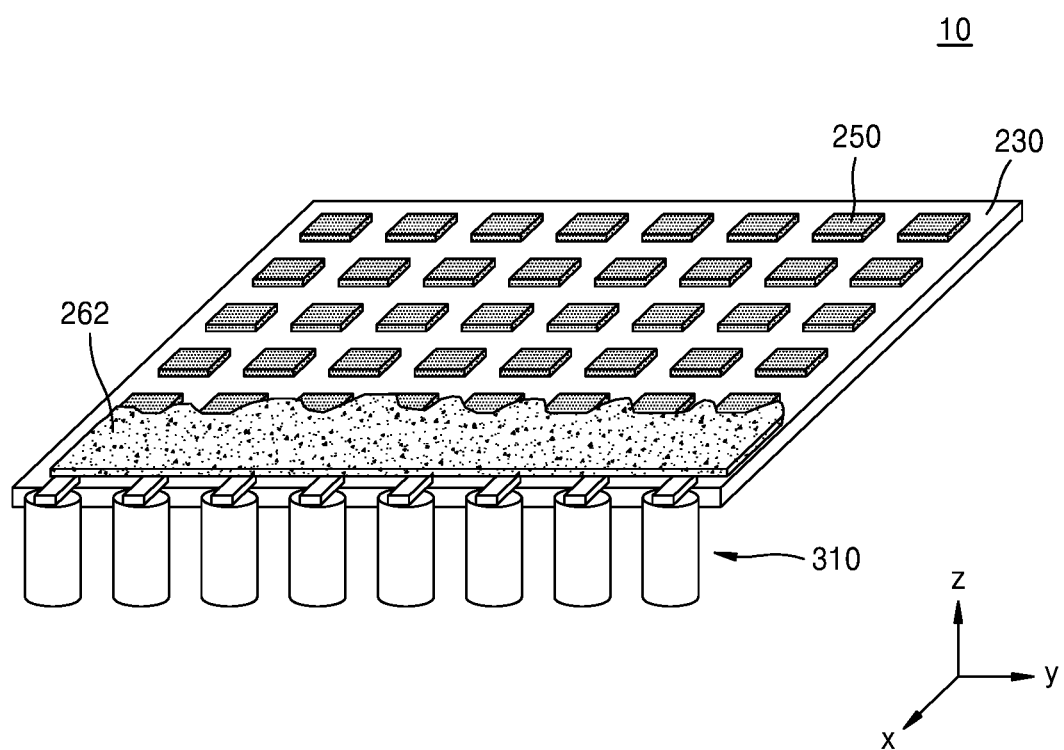
FIG. 1 is a perspective view schematically illustrating a molding apparatus for a semiconductor package according to an embodiment.

FIG. 1 is a perspective view schematically illustrating a molding apparatus 10 for a semiconductor package according to an embodiment.

Referring to FIG. 1, a first direction (x direction) and a second direction (y direction) may cross each other among horizontal directions. For example, the first direction (x direction) and the second direction (y direction) may perpendicularly cross each other. A third direction (z direction) may cross both the first direction (x direction) and the second direction (y direction). For example, the third direction (z direction) may be perpendicularly orthogonal to the first direction (x direction) and the second direction (y direction). The third direction (z direction) may be a vertical direction. Accordingly, the first direction (x direction), the second direction (y direction), and the third direction (z direction) may be orthogonal to each other.

A quadrangular substrate 230 may include a plurality of molding targets 250. Specifically, the plurality of molding targets 250 may be arranged on one surface of the substrate 230 at regular intervals. One surface of the substrate 230 may be a plane parallel to both the first direction (x direction) and the second direction (y direction). Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The substrate 230 may be a printed circuit board (PCB). For example, the substrate 230 may be a substrate in which an electronic circuit is configured by fixing electronic components, such as resistors, capacitors, and integrated circuits, to the surface of a printed wiring substrate, and connecting the electronic components to each other by a copper wiring.

According to an embodiment, although not shown, a wiring structure electrically connecting an upper surface of the substrate 230 to a lower surface of the substrate 230 may be inside the substrate 230.

The molding target 250 may include electronic components, such as a semiconductor chip and a semiconductor package. For example, the molding targets 250 may be various semiconductor packages requiring molding, such as a Package On Package (POP) structure and an interposer-inserted POP (i-POP) structure.

Figure 3:
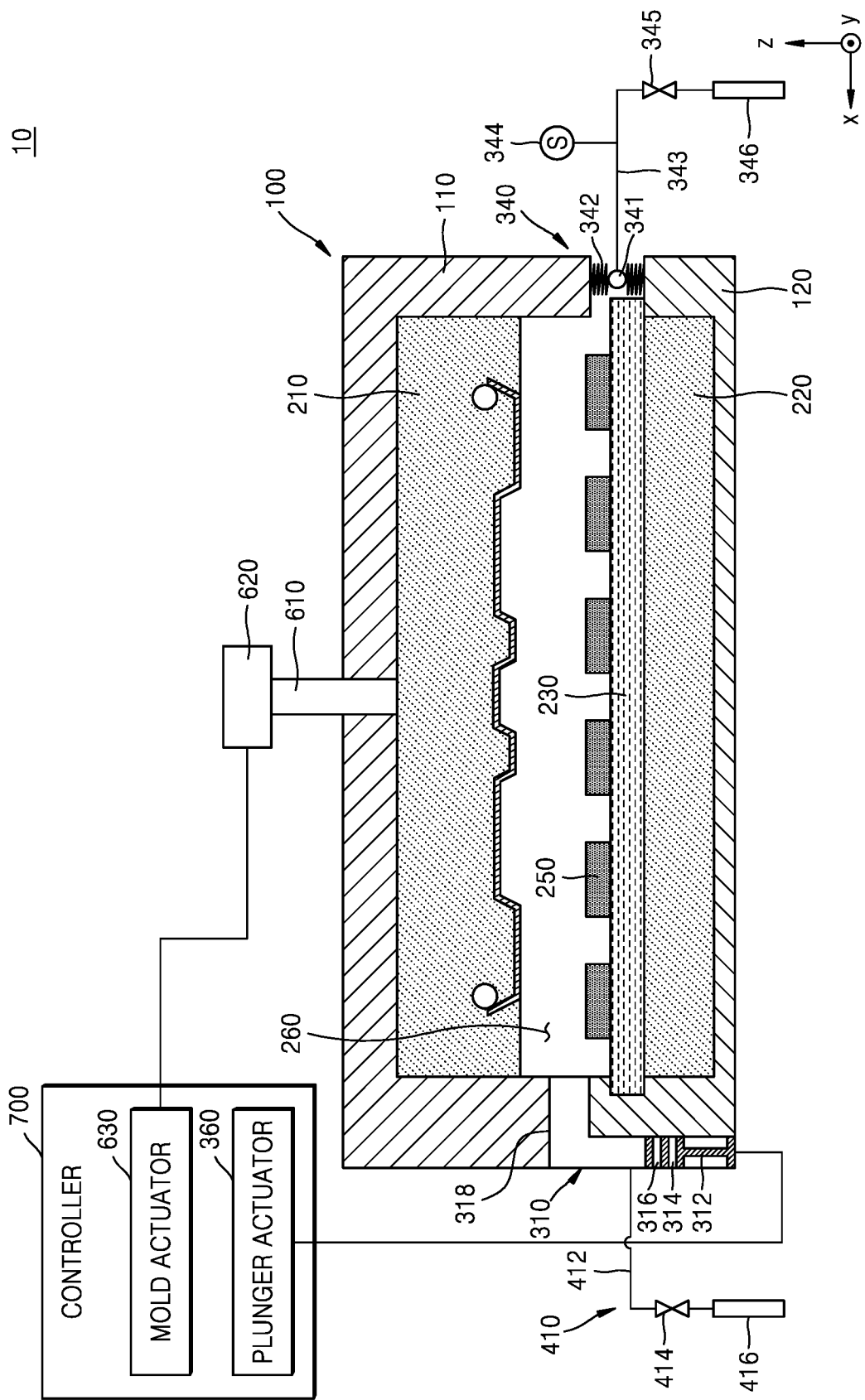
FIG. 3 is a cross-sectional view illustrating the molding apparatus for the semiconductor package shown in FIG. 1.

A plurality of ports 310 may be arranged in the second direction (y direction) along the sidewall of a chamber (see 100 of FIG. 3). The ports 310 may be configured to discharge or supply a molding material in the first direction (x direction) perpendicular to the second direction through the sidewall of the chamber. For example, a hole in the sidewall of the chamber may be formed so that part of the sidewall is above the hole and part of the sidewall is below the hole. A detailed description of a process in which the port 310 discharges the molding material is given below. When the port supplying the molding material is disposed in the floor of the chamber 100, the molding material is not smoothly supplied due to resistance of gravity, or greater energy is required for supplying the molding material. However, when the port for supplying the molding material is disposed on a part of the sidewall of the chamber 100, the molding material can be uniformly and smoothly supplied toward the molding target due to the help of gravity. Ordinal numbers such as "first," "second," "third," etc. may be used simply as labels of certain elements, steps, directions, etc., to distinguish such elements, steps, directions, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 2:
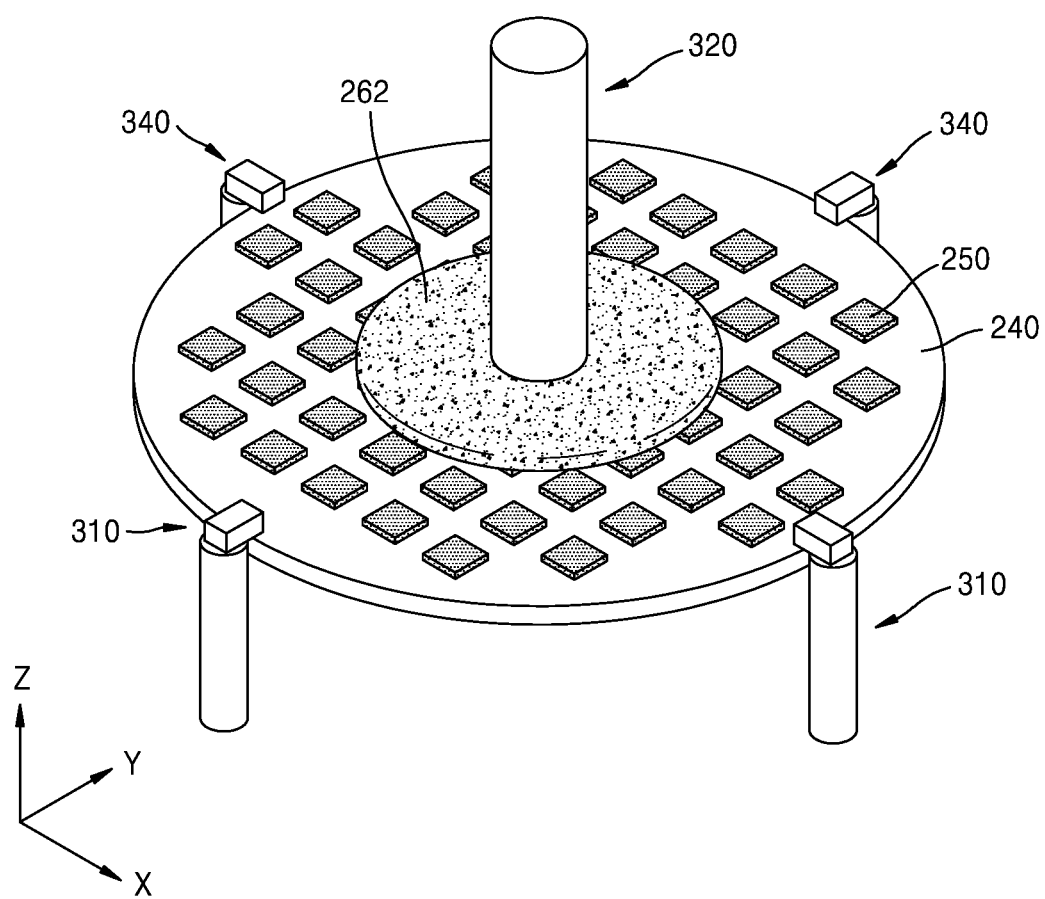
FIG. 2 is a perspective view schematically illustrating a molding apparatus for a semiconductor package according to another embodiment.

FIG. 2 is a perspective view schematically illustrating a molding apparatus 20 for a semiconductor package according to another embodiment.

Referring to FIG. 2, a circular substrate 240 may include the plurality of molding targets 250. Specifically, the plurality of molding targets 250 may be arranged on one surface of the substrate 240 at regular intervals. One surface of the substrate 240 may be a plane parallel to both the first direction (x direction) and the second direction (y direction).

The substrate 240 may be a disk, or wafer, formed by a single crystal pillar made by growing silicon (Si), gallium arsenide (GaAs), etc. being thinly sliced to a constant thickness.

The plurality of ports 310 may be disposed to be spaced apart from each other along the circumference of the circular substrate 240. The ports 310 may be configured to discharge or supply molding materials toward the molding targets 250 arranged on one surface of the substrate 240 at regular intervals. The ports 310 may be configured to discharge or supply a molding material in a horizontal direction through the sidewall of the chamber. A detailed description of a process in which the ports 310 discharge molding materials is given below. An additional port 320 may also be formed at a center of the disk. A detailed description of this port 320 is given below.

A gas adjustor 340 may be disposed to face the port 310 (e.g., to be opposite the port 310). The gas adjustor 340 may be configured to supply or discharge gas onto or away from the substrate 240. A detailed description of a process in which the gas adjustor 340 supplies or discharges gas thereto is given below.

In FIG. 2, the port 310 and the gas adjustor 340 are illustrated as being disposed two each, but the inventive concept is not limited thereto.

FIG. 3 is a cross-sectional view illustrating the molding apparatus 10 for a semiconductor package shown in FIG. 1.

The molding apparatus 10 of the semiconductor package according to an embodiment includes a chamber 100, an upper mold 210, a lower mold 220, the port 310, a plunger 312, a plunger actuator 360, a molding material supplier 410, a mold actuator 630, and the gas adjustor 340.

The chamber 100 may be a housing forming the exterior of the molding apparatus 10 for a semiconductor package of the inventive concept. The chamber 100 may include other components, such as the upper mold 210 or the lower mold 220 therein. The chamber 100 may be configured to isolate the inside and the outside, and when a molding process is performed inside the chamber 100, the inside of the chamber 100 may be maintained in a vacuum unlike the outside. The chamber 100 may be a rectangular chamber in one embodiment, that matches the shape of the substrate 230.

The chamber 100 may include an upper chamber 110 and a lower chamber 120, also described as an upper housing and a lower housing. An upper mold 210 may be disposed in the upper chamber 110, and a lower mold 220 may be disposed in the lower chamber 120. The upper mold 210 may also be described as an upper mold plate, and the lower mold 220 may also be described as a lower mold plate. In a molding apparatus for a semiconductor package according to some embodiments, lower mold 220 may be fixed and the upper mold 210 may move up and down, or the upper mold 210 may be fixed and the lower mold 220 may move up and down, or both the upper mold 210 and the lower mold 220 may move up and down.

The lower mold 220 may be configured to fix and hold the substrate 230 including the plurality of molding targets 250. For example, the lower mold 220 may include sidewalls, notches, or other devices to hold the substrate 230 in place. The lower mold 220 may define a cavity 260 between the lower mold 220 and the upper mold 210 with the molding targets 250 seated on the substrate 230. The substrate may be fixed to the top surface of the lower mold 220. This is described in more detail below.

The cavity 260 may be a space defined between the upper mold 210 and the lower mold 220. The cavity 260 may be a space in which a molding material moves and is disposed on the plurality of molding targets 250. According to some embodiments, the molding material is fluid when the temperature of the molding material increases, and thus, the molding material may be a mold film that fully fills the cavity 260 formed by the upper mold 210 and the lower mold 220 and is cured to cover the plurality of molding targets 250.

The port 310 may provide a passage communicating with the cavity 260 formed between the upper chamber 110 and the lower chamber 120. The port 310 may provide a flow path extending in the first direction (x direction) and the third direction (z direction). The plunger 312 may be located inside the port 310, and may move up and down inside the port 310. For example, the plunger 312 may elevate in the third direction (z direction) inside the port 310. The plunger 312 may move up and down so that the molding material provided in the port 310 may flow. The plunger 312 may pressurize the molding material so that the molding material inside the port 310 is supplied to the cavity 260 through movement in the third direction (z direction) and first direction (x direction), and may perform molding on the plurality of molding targets 250 by using the molding material filled in the cavity 260.

Referring to FIG. 1 together, the molding material supplier 410 may be configured to supply a molding material 262 to the port 310. The molding material 262 may include epoxy mold compound (EMC), for example. However, the embodiments are not limited thereto. The molding material 262 may be, for example, a thermoplastic resin or a thermosetting resin. The resin, for example, may be made of any one of a granular resin, a powdery resin, a liquid resin, a plate-shaped resin, a sheet-shaped resin, a film-shaped resin, and a paste-shaped resin, or a combination thereof. In addition, the resin, for example, may be made of any one of a transparent resin, a translucent resin, and an opaque resin, or a combination thereof. The molding material 262 may be disposed in the port 310 in a solid state and may be liquefied when the temperature of the molding material 262 increases to be fluid. When the molding material 262 is fluid, the molding material 262 may be provided on the plurality of molding targets 250 by the plunger 312, and then cured so that the plurality of molding targets 250 may be molded.

The plunger 312 may be configured to pressurize the molding material 262 inside the port 310. Specifically, the plunger 312 may move up and down within the port 310. The plunger 312 may move upward to push the molding material 262 into the cavity 260. The plunger 312 may have almost the same size as that of the inner wall of the port 310, but a gap may be between the outer surface of the plunger 312 and the inner wall of the port 310.

Because air in the cavity 260 may leak through the gap, the plunger 312 may include a first ring 314. The first ring 314 may be a ring made of a Teflon material, for example. The first ring 314 may completely block a space between the outer surface of the plunger 312 and the inner wall of the port 310 to prevent the air inside the cavity 260 from leaking.

Similar to the first ring 314, a second ring 316 may also completely block the space between the outer surface of the plunger 312 and the inner wall of the port 310 to prevent the air inside the cavity 260 from leaking. The first ring 314 and the second ring 316 may maintain the vacuum of the cavity 260 by sealing between the port 310 and the plunger 312. However, when the plunger 312 repeatedly moves up and down, a phenomenon may occur where the first ring 314 or the second ring 316 is worn, and undesired air flows into the cavity 260 through the gap between the plunger 312 and the port 310.

The controller 700 may control the plunger actuator 360 and the mold actuator 630. The controller 700 may be implemented in hardware, firmware, software, or any combination thereof. For example, the controller 700 may be a computer device, such as a workstation computer, a desktop computer, a laptop computer, or a tablet computer. For example, the controller 700 may include a memory device, such as read only memory (ROM) and random access memory (RAM), and a processor configured to perform certain operations and algorithms, for example, a microprocessor, a central processing unit (CPU), a graphics processing unit (GPU), etc. The controller 700 may control the actions of the various devices described herein, such as the timing for exerting pressure, an amount of pressure, etc.

The plunger actuator 360 may be configured to apply a first pressure to the plunger 312 such that the molding material 262 provided in the port 310 is supplied to the cavity 260. For example, the plunger actuator 360 may include a motor, a hydraulic cylinder, a pneumatic cylinder, etc. For example, the plunger actuator 360 may include a motor, and may control a pressure condition applied to the plunger 312 by adjusting a torque value of the motor. Alternatively, the plunger actuator 360 may control the pressure condition applied to the plunger 312 by inputting air into the port 310. However, the embodiments are not necessarily limited to the above. A detailed description of a process in which the plunger actuator 360 applies the first pressure to the plunger 312 so that the molding material 262 is supplied to the cavity 260 is given below.

In addition, the controller 700 may adjust the rising speed of the plunger 312 in the port 310. For example, the controller 700 may instantaneously cause high pressure to be applied to the plunger 312 in order to increase the flow rate of the molding material 262 in a specific part of the cavity 260. To the contrary, in order to reduce the flow rate of the molding material 262 in a specific part of the cavity 260, the controller 700 may instantaneously cause low pressure to be applied to the plunger 312. It should be noted that one plunger and plunger actuator is described above, but the controller 700 may control the plurality of ports 310, each including a plunger and plunger actuator as described above.

The mold actuator 630 may be configured to apply a second pressure to the upper mold 210 to pressurize the molding material 262 in the cavity 260. For example, the mold actuator 630 may be connected to a driving motor 620 connected to a shaft 610 to control a pressure condition applied to the upper mold 210 by adjusting a torque value of the driving motor 620, which thereby controls a movement pressure applied by the shaft 610 to the upper mold 210. However, the embodiments are not necessarily limited to the above. A detailed description of a process in which the mold actuator 630 applies the second pressure to the upper mold 210 to mold the molding target 250 is given below.

The molding material supplier 410 may be connected to the port 310. The molding material supplier 410 may supply the molding material 262 to the port 310 having a pipe shape. The molding material supplier 410 may include a molding material supply line 412, a nozzle 414, and a fluid supply pump 416. The fluid supply pump 416 may supply the molding material 262 in a fluid state to the molding material supply line 412. The nozzle 414 may be configured to adjust the flow rate of the molding material 262 in the fluid state supplied by the fluid supply pump 416.

The gas adjustor 340 may be disposed on the sidewall of the chamber 100 to face the port 310. The gas adjustor 340 may include a vent hole 341, a sealing member 342, a gas pipe 343, a sensor 344, a gas nozzle 345, and a gas pump 346. The sealing member 342 may be between the upper chamber 110 and the lower chamber 120. The sealing member 342 may be disposed where the upper chamber 110 and the lower chamber 120 are engaged with each other. The sealing member 342 may perform sealing on a part where the lower chamber 120 and the upper chamber 110 are engaged with each other, except for the vent hole 341. The volume of the sealing member 342 may increase or decrease according to a force applied thereto. The sealing member 342 may be configured to expand or contract according to the force applied thereto. Accordingly, the sealing member 342 may efficiently perform sealing and venting. The sealing member 342 may be, for example, a flexible rubber or plastic material that can expand and contract while maintaining a seal. For example the sealing member 342 may have an accordion-shaped configuration. Also, though only one vent hole 341 is shown, a plurality of vent holes 341 may be formed, and may be connected to a plurality of respective gas pipes 343. In this case, a plurality of sensors 344, gas nozzles 345, and/or gas pumps 346 may also be used.

The vent hole 341 may be formed adjacent to the sealing member 342 (e.g., it may be a hole in the sealing member 342). The vent hole 341 may be disposed between the upper chamber 110 and the lower chamber 120, where the upper chamber 110 and the lower chamber 120 are engaged with each other. The vent hole 341 may be opposite the port 310 within the chamber 100. The air in the cavity 260 may be removed through the vent hole 341. For example, the vent hole 341 may be connected to the gas pump 346 to discharge the air inside the cavity 260 to the outside. The gas pipe 343 may serve as a connection passage between the vent hole 341 and the gas pump 346. The gas nozzle 345 may be configured to adjust the flow rate of introduced or discharged gas through the gas pump 346.

The sensor 344 may be connected to the vent hole 341. The sensor 344 may detect whether the air in the cavity 260 leaks by sensing the pressure of the vent hole 341. Accordingly, the sensor 344 may maintain the vacuum of the cavity 260.

Figure 4:
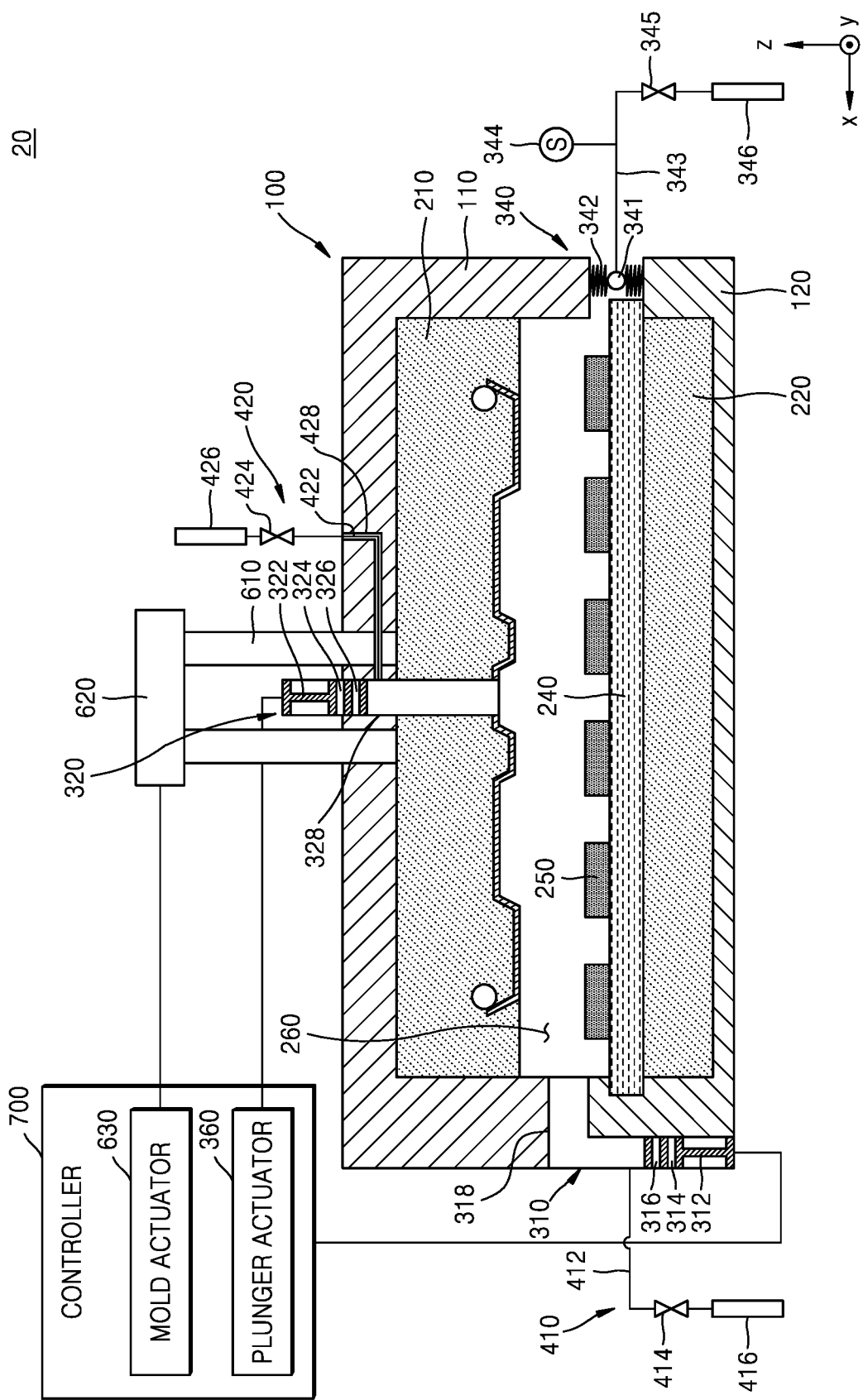
FIG. 4 is a cross-sectional view illustrating the molding apparatus for the semiconductor package shown in FIG. 2.

FIG. 4 is a cross-sectional view illustrating the molding apparatus 20 for a semiconductor package shown in FIG. 2.

Specifically, the molding apparatus 20 for a semiconductor package may be substantially the same as the molding apparatus 10 for a semiconductor package of FIGS. 1 and 3 except that the molding apparatus 20 for the semiconductor package includes the substrate 240 instead of the substrate 230 and further includes different arrangements of first ports 310 and includes a second port 320 and a second molding material supplier 420. The same reference numerals as in FIGS. 1 and 3 denote the same members. In FIG. 4, the same descriptions as those of FIGS. 1 to 3 are briefly given or omitted.

The molding apparatus 20 of a semiconductor package according to an embodiment includes the chamber 100, the upper mold 210, the lower mold 220, the first port 310, the first plunger 312, the second port 320, a second plunger 322, the plunger actuator 360, the molding material supplier 410, the mold actuator 630, and the gas adjustor 340. The chamber 100 may be a cylindrical chamber, for example, that matches the shape of the substrate 240.

The lower mold 220 may be configured to fix and hold the substrate 240 including the plurality of molding targets 250. Unlike the substrate 230 of FIG. 3, the substrate 240 may be in the form of a disk having a circular cross-section. The lower mold 220 may have sidewalls, notches, or other devices to hold the substrate 240 in place. The substrate 240 may be a semiconductor wafer, for example. The cavity 260 may be formed between the lower mold 220 and the upper mold 210 with the molding target 250 seated on the substrate 240 when the upper chamber 110 is coupled to the lower chamber 120. This is described in more detail below.

The second port 320 may be formed on the upper portion of the chamber 100 (e.g., on a ceiling, or top surface, of the chamber) to provide a passage communicating with the cavity 260. The second port 320 may be aligned in the third direction (z direction) at the center of the circular cross-section of the substrate 240. The second port 320 may discharge the molding material 262 toward the substrate 240. The second port 320 may provide the passage extending in the third direction (z direction). The second plunger 322 may be positioned inside the second port 320, and the second plunger 322 may move up and down inside the second port 320. As the second plunger 322 moves up and down, a molding material previously disposed on the second plunger 322 inside the second port 320 may be filled into the cavity 260 so that molding may be performed on the plurality of molding targets 250.

The first port 310 may be formed between the upper chamber 110 and the lower chamber 120, and thus may be formed in a sidewall of the chamber 100, to provide a passage communicating with the cavity 260. The first port 310 may provide the passage extending in the first direction (x direction) and the third direction (z direction). The first plunger 312 may be positioned inside the first port 310, and the first plunger 312 may move up and down inside the first port 310. The first plunger 312 may supply the molding material inside the first port 310 to the cavity 260 by moving up and down, and may perform molding on the plurality of molding targets 250 by using the molding material filled in the cavity 260.

The controller 700 may control the plunger actuator 360 and the mold actuator 630. The plunger actuator 360 may be configured to cause a first pressure to be applied to the first plunger 312 and the second plunger 322 so that the molding material 262 provided in the first port 310 and the second port 320 is supplied to the cavity 260. For example, the plunger actuator 360 may be connected to a motor to control a pressure condition applied to the first plunger 312 and the second plunger 322 by adjusting a torque value of the motor. Alternatively, the plunger actuator 360 may control the pressure condition applied to the first plunger 312 and the second plunger 322 by inputting air into the first port 310 and the second port 320. Accordingly, the plunger actuator 360 may be connected to both the first port 310 and the second port 320. However, the embodiments are not necessarily limited to the above. A detailed description of a process in which the plunger actuator 360 applies the first pressure to the first plunger 312 and the second plunger 322 so that the molding material 262 is supplied to the cavity 260 is given below.

The plunger 322 may be configured to pressurize the molding material inside the second port 320. Specifically, the plunger 322 may move up and down within the second port 320. The plunger 322 may move downward to push the molding material into the cavity 260. The plunger 322 may have almost the same size as that of the inner wall of the second port 320, but a gap may be between the outer surface of the plunger 322 and the inner wall of the second port 320.

The plunger actuator 360 may perform the steps described above in connection with the first plunger 312, and may also control the second plunger 322 in a similar manner. Because air in the cavity 260 may leak through the gap between the second plunger 322 and the inner wall of the second port 320, the second plunger 322 may include a first ring 324. The first ring 324 may be a ring made of a Teflon material, for example. The first ring 324 may completely block a space between the outer surface of the second plunger 322 and the inner wall of the second port 320 to prevent the air inside the cavity 260 from leaking.

Similar to the first ring 324, a second ring 326 may also completely block the space between the outer surface of the second plunger 322 and the inner wall of the second port 320 to prevent the air inside the cavity 260 from leaking. The first ring 324 and the second ring 326 may maintain the vacuum of the cavity 260 by sealing between the second port 320 and the second plunger 322. However, when the second plunger 322 repeatedly moves up and down, a phenomenon may occur where the first ring 324 or the second ring 326 is worn, and undesired air flows into the cavity 260 through the gap between the second plunger 322 and the second port 320.

Figure 5:
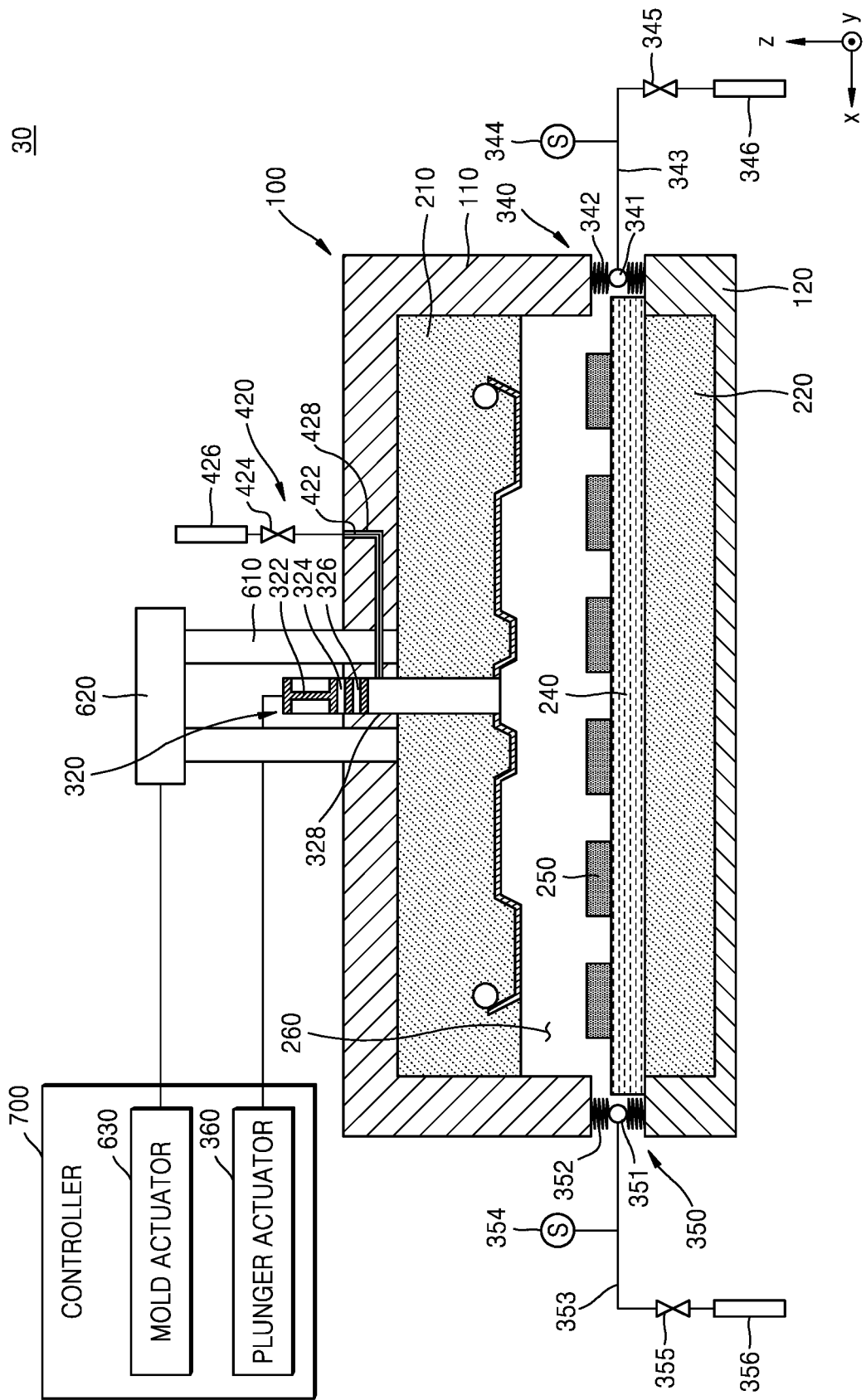
FIG. 5 is a cross-sectional view illustrating a molding apparatus for a semiconductor package according to another embodiment.

FIG. 5 is a cross-sectional view illustrating a molding apparatus 30 for a semiconductor package according to another embodiment.

Specifically, the molding apparatus 30 for a semiconductor package may be substantially the same as the molding apparatus 10 of FIGS. 2 and 4 except that the molding apparatus 30 of FIG. 5 includes a second gas adjustor 350 (and may include a plurality of gas adjustors 350 arranged around the circumference of the chamber 100), and does not include the ports 310 along the sidewalls of the chamber 100. The same reference numerals as in FIGS. 2 and 4 denote the same members. In FIG. 5, the same descriptions as those of FIGS. 2 to 4 are briefly given or omitted.

The first gas adjustor 340 and the second gas adjustor 350 may be disposed on the sidewalls of the chamber 100. The first gas adjustor 340 may include a first vent hole 341, a first sealing member 342, a first gas pipe 343, a first sensor 344, a first gas nozzle 345, and a first gas pump 346. The second gas adjustor 350 may include a second vent hole 351, a second sealing member 352, a second gas pipe 343, a second sensor 354, a second gas nozzle 355, and a second gas pump 356. The second gas adjustor 350 may be configured to perform the same function as the first gas adjustor 340.

According to an embodiment, the molding apparatus 30 for a semiconductor package may include only the second port 320 vertically spaced apart from the center of the circular cross-section of a substrate, differently from the molding apparatus 20 of the semiconductor package shown in FIG. 4. That is, the molding apparatus 30 of a semiconductor package may not include the first ports 310 (see FIG. 4) formed on the inner sidewall of a chamber.

FIGS. 6A to 6D are cross-sectional views illustrating an operation process of the molding apparatus 10 of the semiconductor package shown in FIG. 1.

Figure 6A:
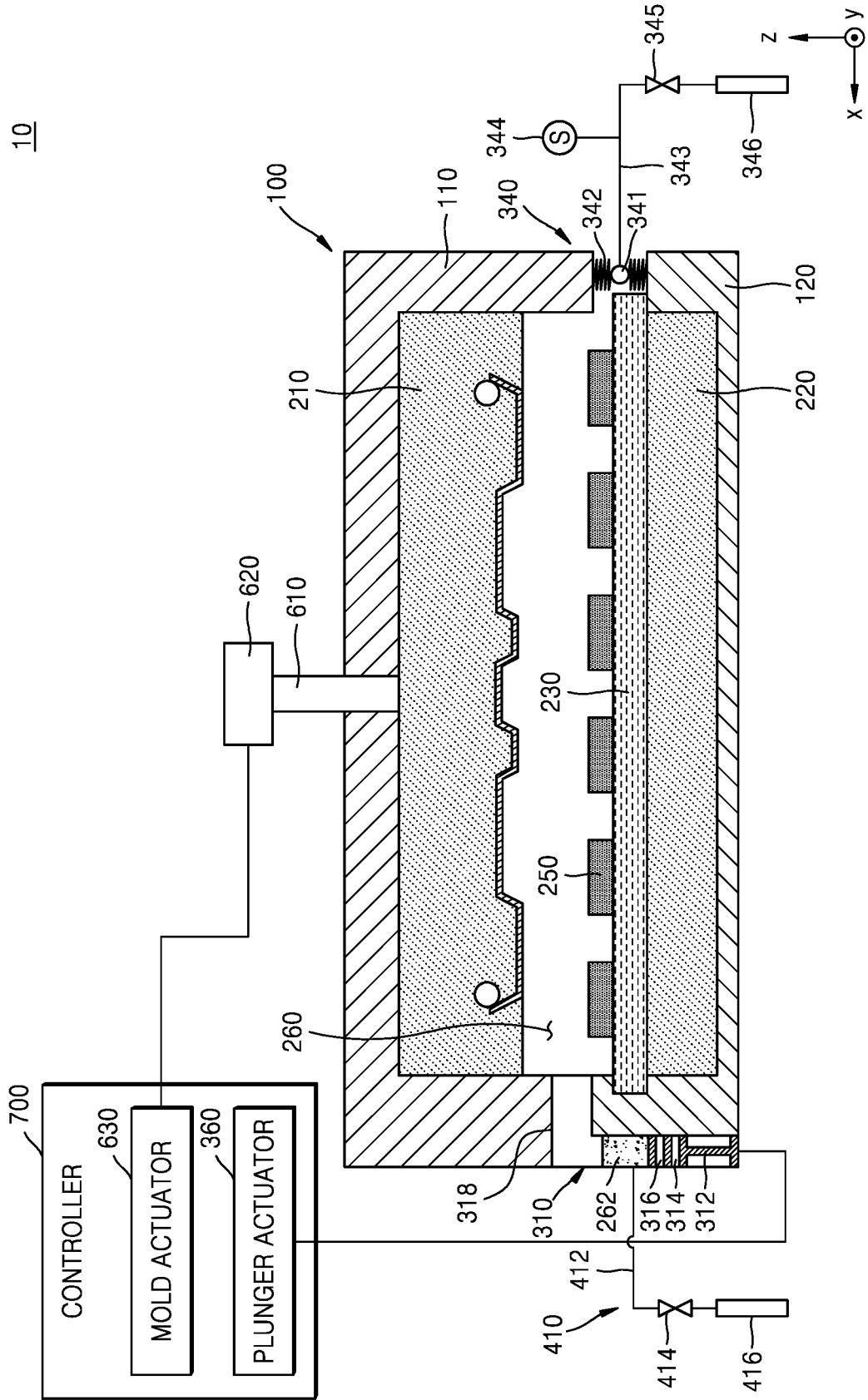
FIGS. 6A to 6D are cross-sectional views illustrating an operation process of the molding apparatus of the semiconductor package shown in FIG. 1.
Figure 6B:
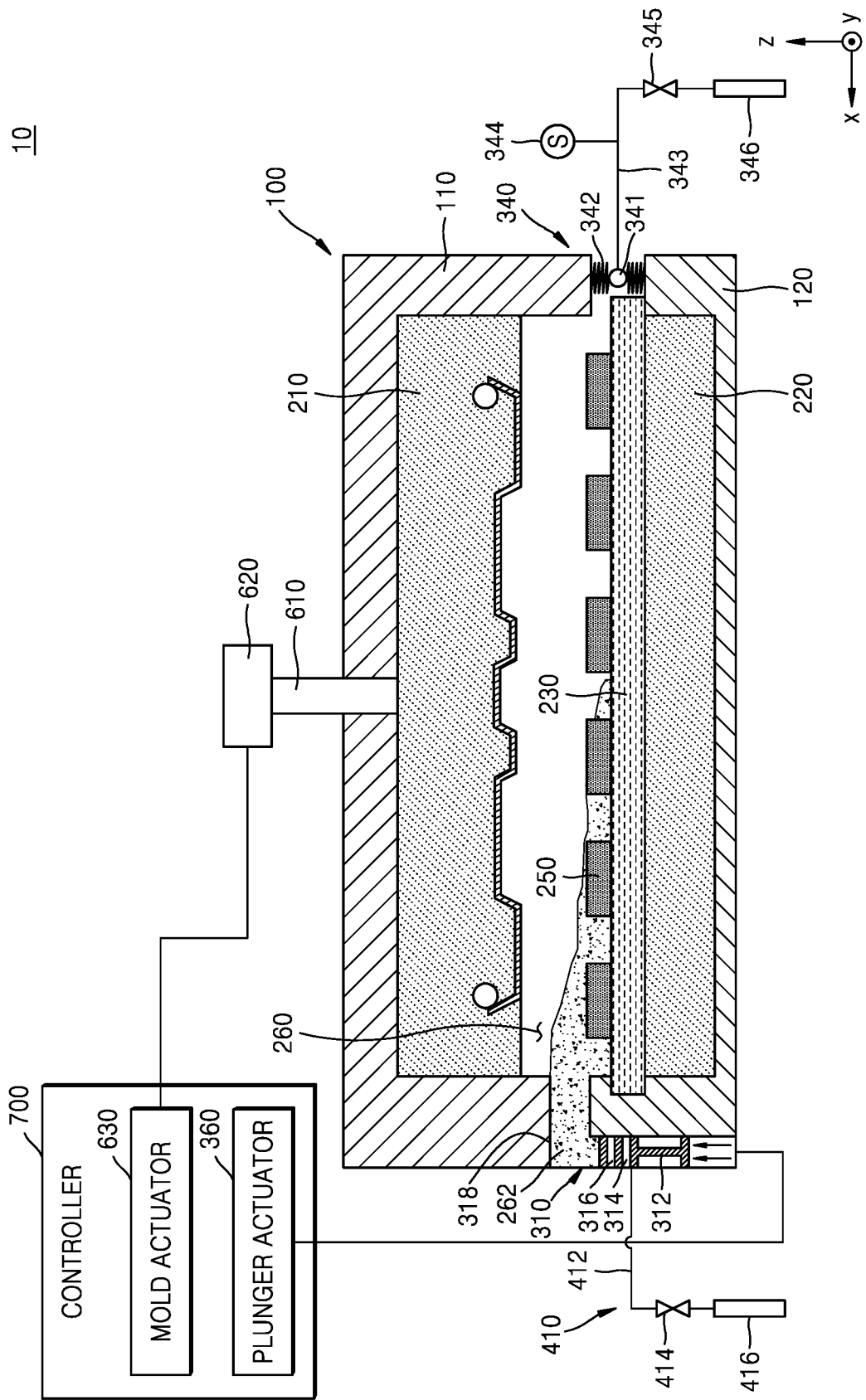

Referring to FIGS. 6A and 6B, the molding material 262 may be supplied from the molding material supplier 410 and accumulated in the port 310. After the molding material 262 is supplied to the port 310, the plunger actuator 360 may apply a first pressure to the plunger 312. The first pressure may be a pressure applied to the plunger 312 to allow the plunger 312 to move along the inner sidewall of the port 310. When the first pressure increases, the plunger 312 may more quickly move along the inner sidewall of the port 310, and the molding material 262 may be supplied to the cavity 260 more quickly.

Although not shown in the drawings, an empty space may be between the molding target 250 and the substrate 230. The molding material 262 may be supplied through the empty space. The empty space may be formed, for example, between solder balls or bumps connecting the molding target 250 to the substrate 230. When the molding material 262 is supplied to the cavity 260, the flow of a fluid in a direction without an obstacle (e.g., above the molding targets 250) may be relatively fast, and the flow of the fluid in a direction with the obstacle (e.g., below the molding targets 250) may be relatively slow. Therefore, there is a possibility that a void may be generated in the space between the molding target 250 and the substrate 230 due to a difference in the speed of the molding material 262 for each region. In some embodiments, the molding material 262 may be supplied to the cavity 260 without generating a void by maintaining the first pressure applied to the plunger 312 to move the plunger 312 along the inner sidewall of the port 310 to be equal to or less than 5 MPa.

The vent hole 341 may be connected to the gas pump 346 to discharge air inside the cavity 260 to the outside. When the molding material 262 is supplied to the cavity 260, the vent hole 341 may discharge the air inside the cavity 260 to the outside to make the cavity 260 be in a vacuum state. The cavity 260 in the vacuum state may prevent generation of a void. To this end, the gas pump 346 may suck air through the vent hole 341. Specifically, the gas pump 346 may suck air through the vent hole 341 before the mold actuator 630 applies the first pressure to the upper mold 210. The gas pump 346 may also suck air through the vent hole 341 before the plunger actuator 360 applies the first pressure to the plunger 312. As the gas pump 346 sucks air through the vent hole 341, the cavity 260 may be in the vacuum state. The vacuum state referred to herein refers to a state where the pressure of the cavity 260 is equal to or less than 1 Torr. The gas pump 346 may suck air until the pressure of the cavity 260 is equal to or less than 1 Torr.

Figure 6C:
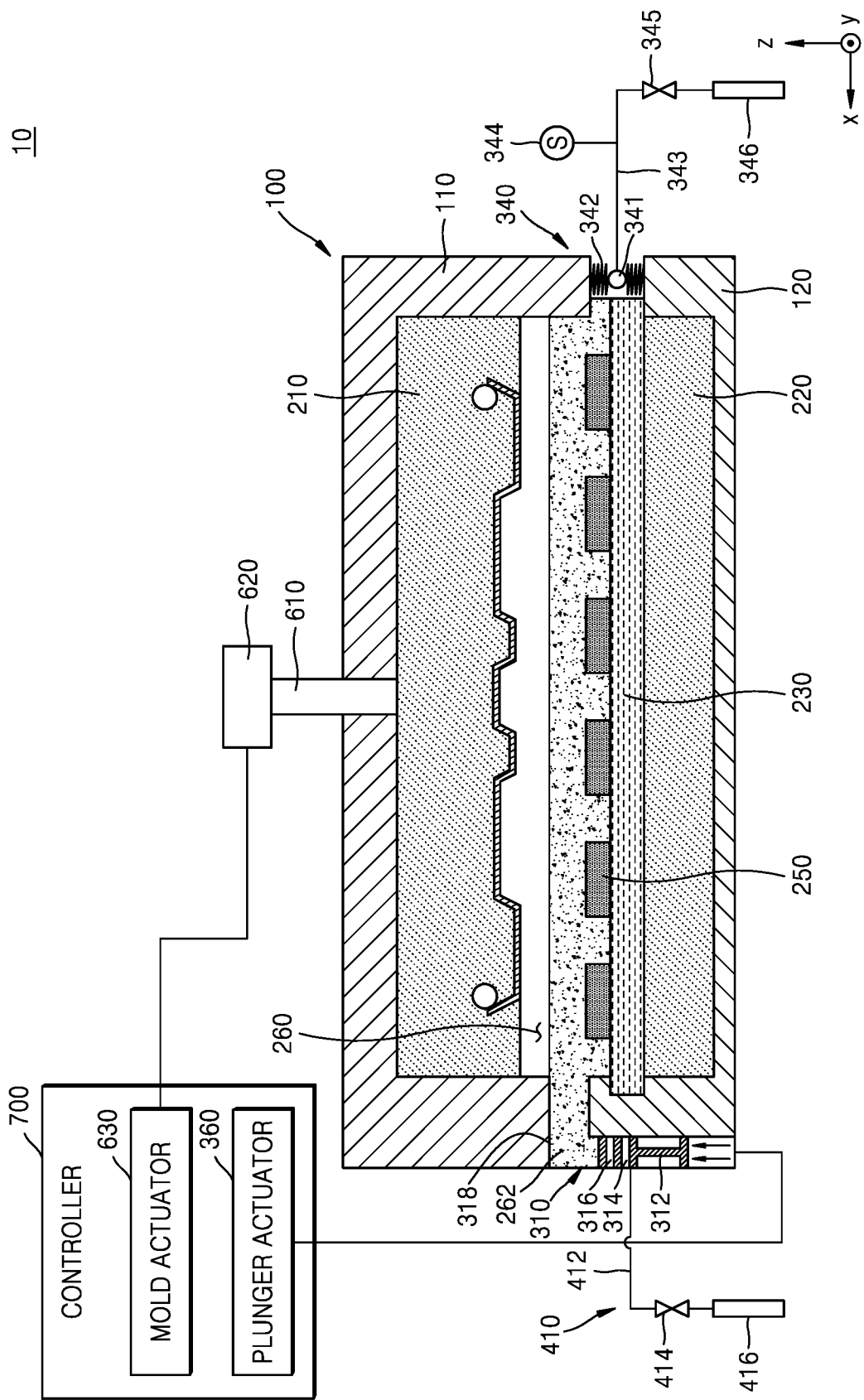
Figure 6D:
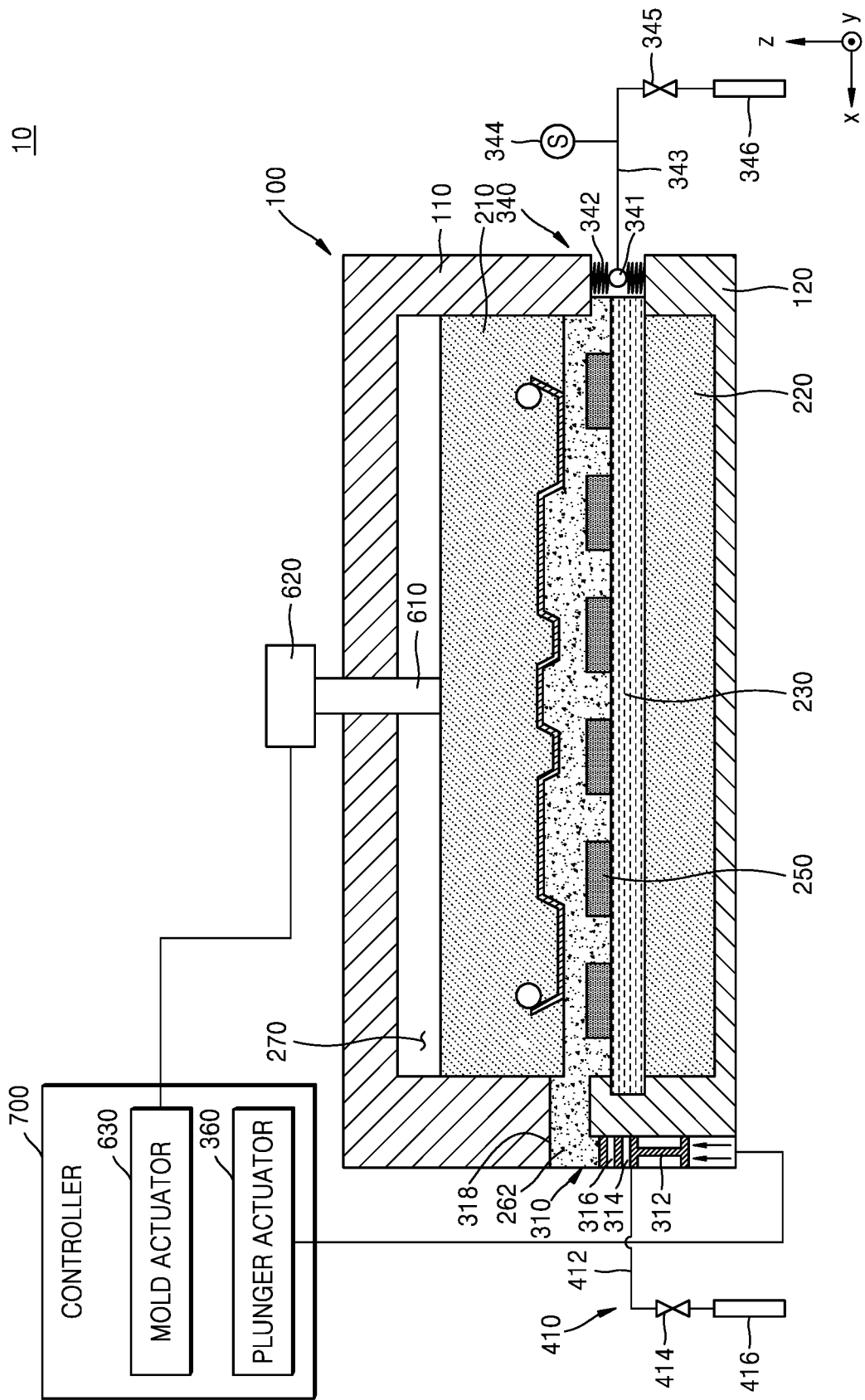

Referring to FIGS. 6C and 6D, the mold actuator 630 may operate after the molding material 262 is sufficiently supplied to the cavity 260 to cover the plurality of molding targets 250. The mold actuator 630 may be configured to apply a second pressure to the upper mold 210 to pressurize the molding material 262 in the cavity 260. Specifically, the mold actuator 630 may apply the second pressure to the upper mold 210 after the molding material 262 molds (e.g., covers) the molding target 250 arranged at the farthest distance from the port 310. In one embodiment, this may be before the molding material 262 completely covers an entire top surface of the substrate or completely fills the cavity 260. For example, a sensor may detect when this occurs. In this regard, the second pressure may be higher than the first pressure in order for the molding material 262 to sufficiently cover and mold the molding targets 250.

The plunger actuator 360 may reduce the first pressure applied to the plunger 312 after the mold actuator 630 applies the second pressure to the upper mold 210 and pressurizes the molding material 262 in the cavity 260. For example, in some embodiments, the first pressure applied to the plunger 312 may be applied at the same time as the second pressure applied to the upper mold 210, after which the first pressure applied to the plunger 312 is reduced while the second pressure is continued to be applied to the upper mold 210. Therefore, while molding material 262 is still being supplied to the cavity 260, the second pressure may be initially applied by the mold actuator 630, and thereafter, while the second pressure continues to be applied by the mold actuator 630, the first pressure applied by the plunger actuator 360 may be decreased.

The vent hole 341 may be connected to the gas pump 346 to have external air introduced into the cavity 270. To this end, the gas pump 346 may supply air to the cavity 270 through the vent hole 341. The gas pump 346 may make the pressure of the cavity 270 be equal to atmospheric pressure by supplying air to the cavity 270. Atmospheric pressure here refers to a state where pressure is equal to or greater than 760 torr. Accordingly, the gas pump 346 may supply air until the pressure of the cavity 270 is equal to or greater than 760 torr. According to an embodiment, the gas pump 346 may supply air through the vent hole 341 after the mold actuator 630 applies the second pressure to the upper mold 210.

According to an embodiment, the molding apparatus 10 of the semiconductor package may perform a molding process primarily by supplying the molding material 262 to the cavity 260 through the port 310, and then may perform a molding process secondarily by driving the upper mold 210 and pressurizing the molding material 262. The molding apparatus 10 of a semiconductor package may continuously perform a primary molding process and a secondary molding process, thereby preventing the generation of a void. Specifically, the first pressure applied to the plunger 312 to move the plunger 312 along the inner sidewall of the port 310 may remain to be equal to or less than 5 MPa, and thus, the generation of a void in the molding material 262 may be prevented. Subsequently, at first while the first pressure is still applied to the plunger 312, and then after the first pressure applied to the plunger 312 is reduced and released, the mold actuator 630 may minimize the generation of a void by applying the second pressure to the upper mold 210 and pressurizing the molding material 262 in the cavity 260.

FIGS. 7A to 7D are cross-sectional views illustrating an operation process of the molding apparatus of the semiconductor package shown in FIG. 2.

Specifically, the molding apparatus 20 of a semiconductor package may be substantially the same as the molding apparatus 10 of a semiconductor package shown in FIGS. 6A to 6D except that the molding apparatus 20 of FIGS. 7A-7D includes the substrate 240 instead of the substrate 230, and further includes the second port 320 and the second molding material supplier 420. The same reference numerals as in FIGS. 6A to 6D denote the same members. In FIGS. 7A to 7D, the same descriptions as in FIGS. 6A to 6D are briefly given or omitted.

Figure 7A:
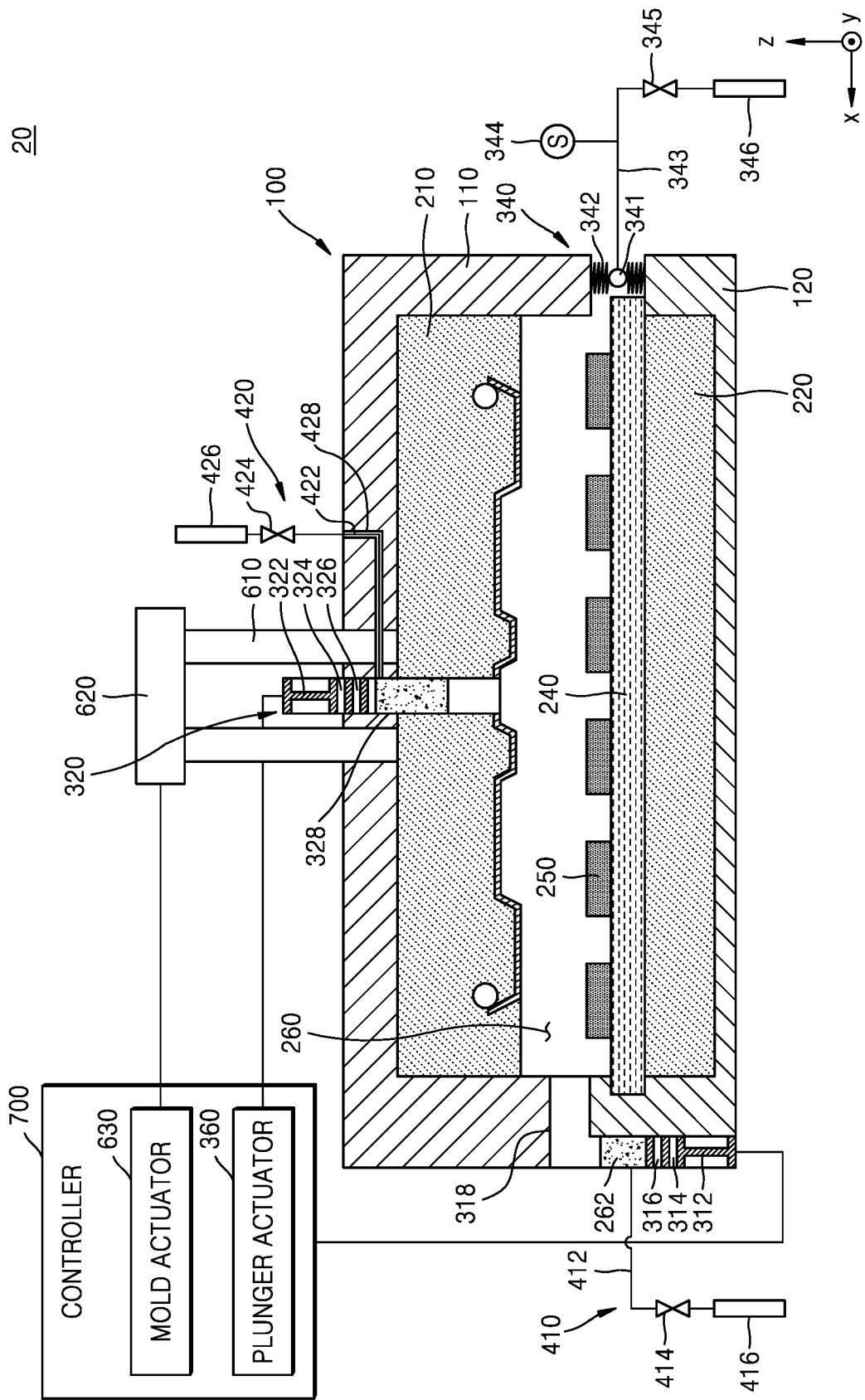
FIGS. 7A to 7D are cross-sectional views illustrating an operation process of the molding apparatus of the semiconductor package shown in FIG. 2.
Figure 7B:
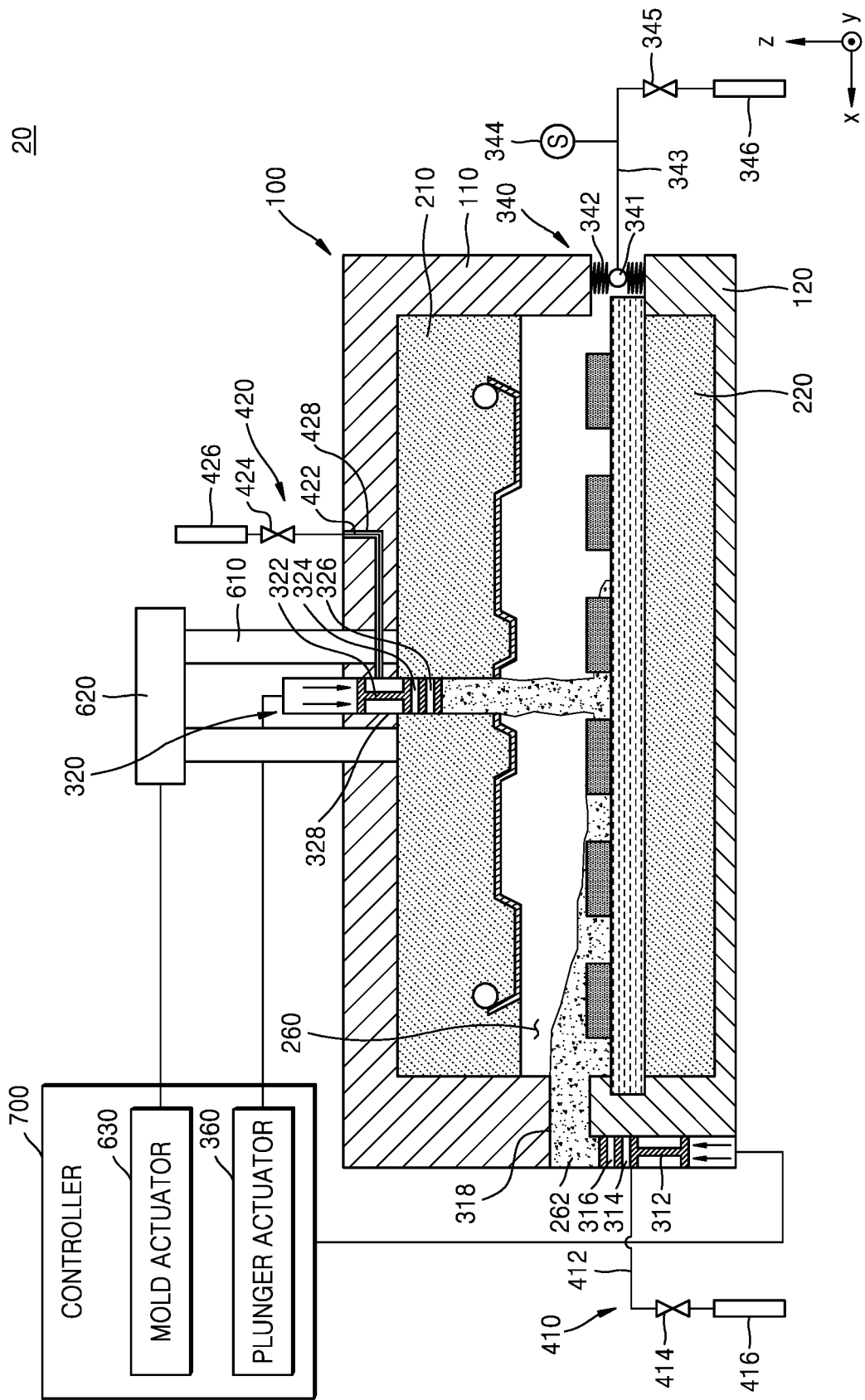

Referring to FIGS. 7A and 7B, the molding material 262 may be supplied from the first molding material supplier 410 and the second molding material supplier 420 and respectively accumulated in the second port 320 formed in the upper portion of a chamber and the first port 310 formed in the side portion of the chamber. After the molding material 262 is supplied to the second port 320 and the first port 310, the plunger actuator 360 may apply a first pressure to the first plunger 312 and the second plunger 322. The first pressure may be a pressure applied to respectively move the first plunger 312 and the second plunger 322 along the inner sidewalls of the second port 320 and the first port 310. When the first pressure increases, the first plunger 312 and the second plunger 322 may more quickly move along the inner sidewalls of the second port 320 and the first port 310, respectively, and the molding material 262 may also be supplied to the cavity 260 more quickly.

Figure 7C:
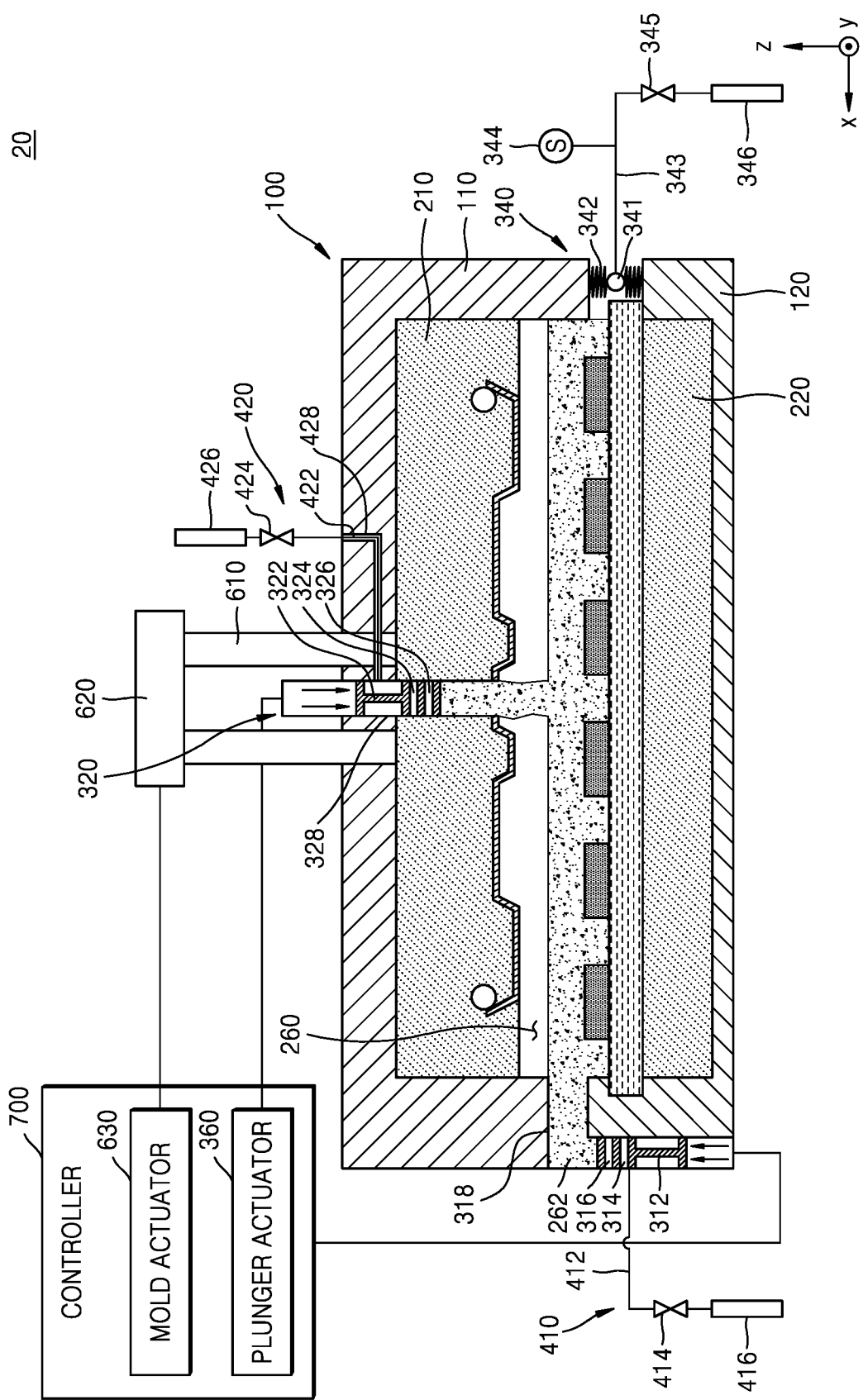
Figure 7D:
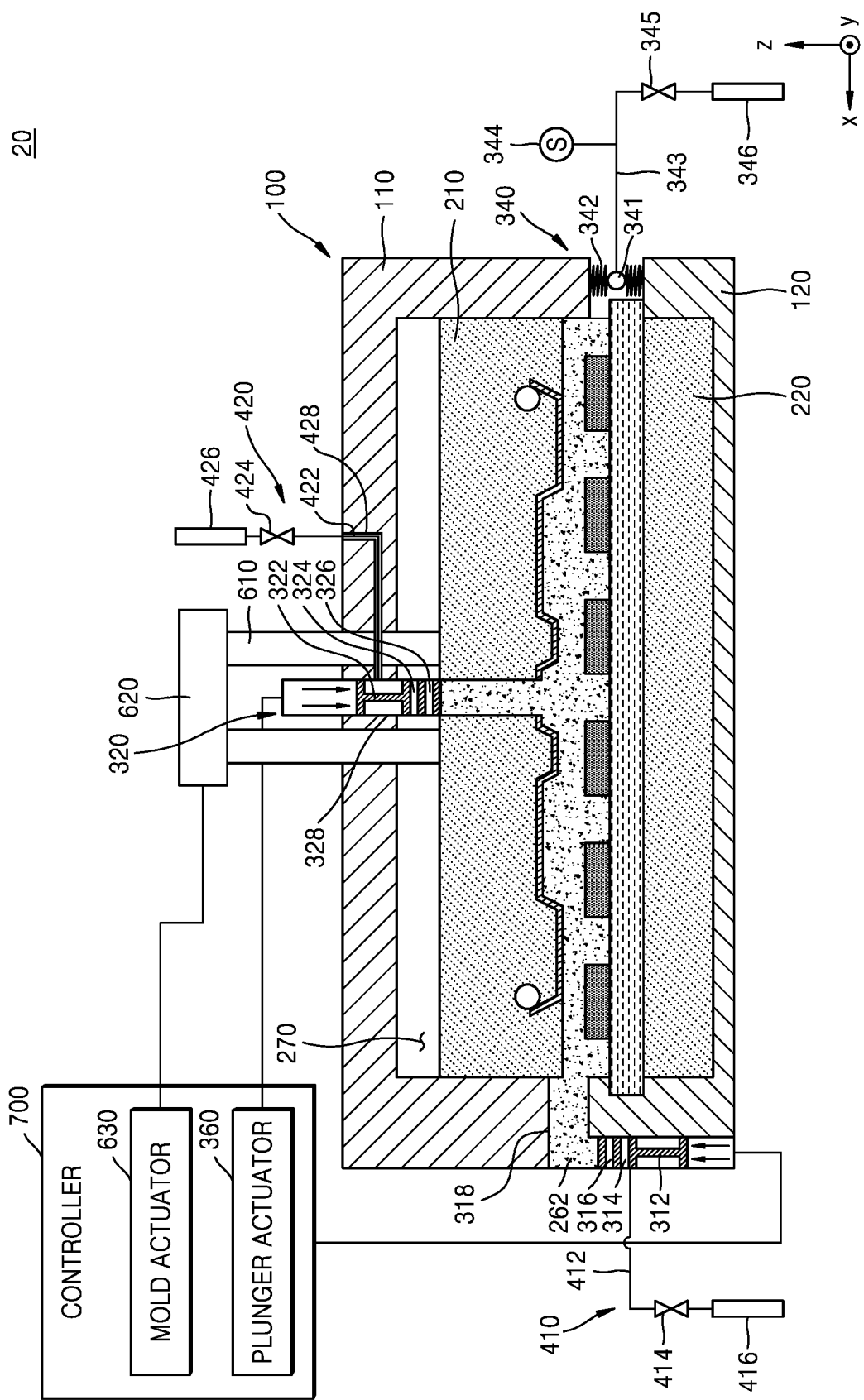

Referring to FIGS. 7C and 7D, after the molding material 262 is sufficiently supplied to the cavity 260, and in some embodiments, while the molding material 262 is still being supplied to the cavity 260, the mold actuator 630 may operate. The mold actuator 630 may be configured to apply a second pressure to the upper mold 210 and pressurize the molding material 262 in the cavity 260. Specifically, the mold actuator 630 may mold the molding target 250 after the molding material 262 is arranged at the farthest distance from the center of the substrate 240, and then apply the second pressure to the upper mold 210. In this regard, the second pressure may be higher than the first pressure in order for the molding material 262 to sufficiently mold the molding target 250.

The plunger actuator 360 may reduce the first pressure applied to the first plunger 312 and/or the second plunger 322 after the mold actuator 630 has already begun to apply the second pressure to the upper mold 210 to pressurize the molding material 262 in the cavity 260.

The vent hole 341 formed in the sidewall of the chamber may be connected to the gas pump 346 and have external air introduced into the cavity 270, now formed above the upper mold 210. To this end, the gas pump 346 may supply air to the cavity 260 through the vent hole 341. According to an embodiment, the gas pump 346 may supply air into the cavity 260 through the vent hole 341 after the mold actuator 630 applies the second pressure to the upper mold 210.

According to an embodiment, the molding apparatus 20 of the semiconductor package may perform a molding process primarily by supplying the molding material 262 to the cavity 260 through the second port 320 and the first port 310 and then may perform a molding process secondarily by driving the upper mold 210 and pressurizing the molding material 262. In this regard, the second port 320 is vertically spaced apart from the center of a circular cross-section of a substrate, thereby uniformly supplying the molding material 262 onto the substrate. According to an embodiment, the molding apparatus 20 of a semiconductor package may continuously, and for a particular time period simultaneously, perform a primary molding process and a secondary molding process, thereby preventing the generation of a void. Specifically, the first pressure applied to move the plunger 312 along the inner sidewall of the port 310 may remain to be equal to or less than 5 MPa, and thus, the generation of a void may be prevented, and the molding material 262 may be supplied. Subsequently, and with some overlap with the first pressure, the mold actuator 630 may minimize the generation of a void by applying the second pressure to the upper mold 210 and pressurizing the molding material 262 in the cavity 260.

Figure 8:
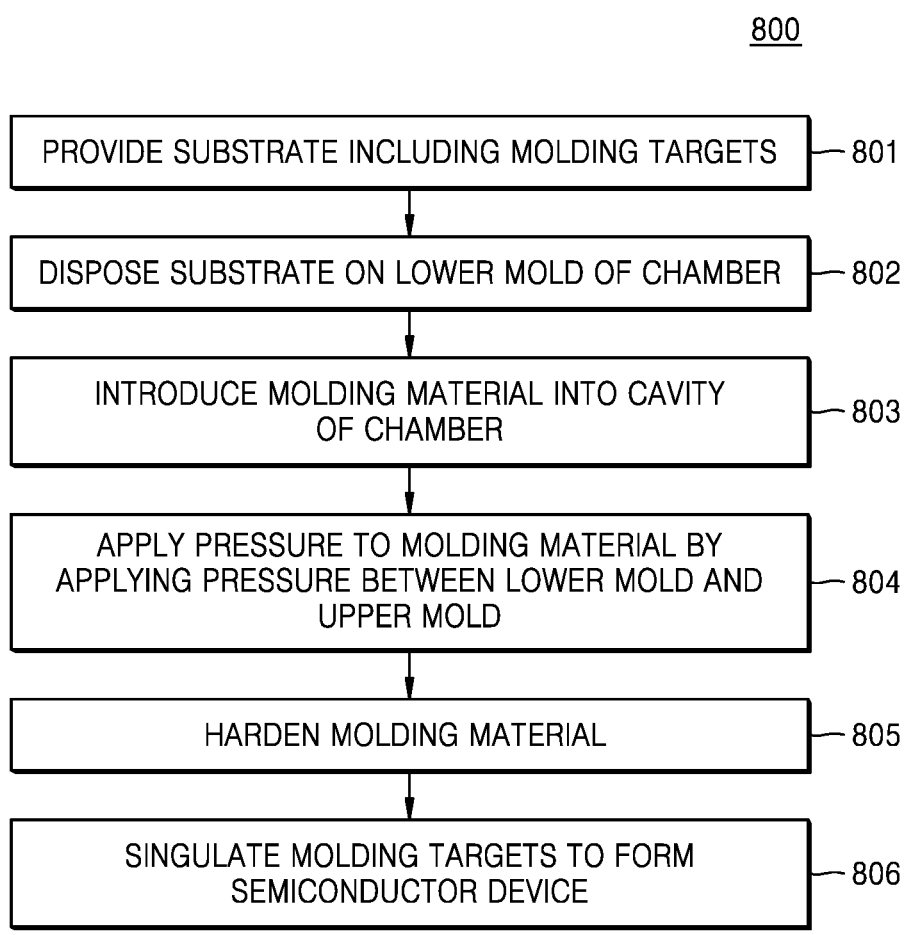
FIG. 8 is a flow chart diagram showing an example method of manufacturing a semiconductor device using an example molding apparatus, according to an embodiment.

FIG. 8 is a flow chart diagram showing an example method 800 of manufacturing a semiconductor device using an example molding apparatus, according to an embodiment. As can be seen in FIG. 8, in step 801, a substrate including a plurality of molding targets arranged in an array pattern is provided. The substrate may be, for example, a package substrate for a semiconductor package, which may be a package-on-package device. The molding targets may be, for example semiconductor chips, or semiconductor packages, including conductive bumps or balls formed on a bottom surface and connected to the substrate. The substrate may be formed of an insulating material, or a semiconductor material.

In step 802, the substrate including the molding targets is disposed on a lower mold of a chamber, such as lower mold 220 depicted in the previous figures. In step 803, molding material may be introduced to a cavity in the chamber, for example, as depicted and described in FIGS. 6A and 6B, or 7A and 7B, by applying pressure to a plunger 312 and/or 322. In step 804, a pressure may be applied to the molding material using pressure applied between the lower mold 220 and the upper mold 210 to compact and fill the mold to cover the plurality of molding targets, including spaces between each of the plurality of molding targets and the substrate. The pressure applied in step 804 may be applied at the same time as introducing molding material to the cavity, e.g., at the end portion of step 803. Then, in step 805, the molding material may be hardened. For example, in some embodiments, a temperature of the molding material may be adjusted to cure the molding material.

Next, after the molding material is completely hardened, in step 806, the substrate may be removed from the chamber, and may be placed in a chamber that performs further processing. For example, the substrate may be moved to a chamber where dicing of the substrate is performed, to singulate semiconductor devices (e.g., packages) from each other, resulting in a plurality of separated, completed semiconductor devices.

While aspects of the inventive concept has been particularly shown and described with reference to embodiments thereof, it will be understood that various changes in form and details may be made therein without departing from the spirit and scope of the following claims.

What is claimed is:

1. A molding apparatus for a semiconductor package, the molding apparatus comprising:
   a chamber comprising a lower mold configured to hold a substrate comprising a plurality of molding targets, an upper mold configured to move up and down with respect to the lower mold and define a cavity between the upper mold and the lower mold; and a port configured to provide a passage communicating with the cavity;
   a molding material supplier configured to supply a molding material to the port;
   a plunger configured to pressurize the molding material inside the port;
   a plunger actuator configured to apply a first pressure to the plunger such that the molding material provided in the port is supplied to the cavity;
   a mold actuator configured to control actuation of the upper mold;
   wherein the plunger actuator is configured to supply the molding material to the cavity by applying the first pressure to the plunger,
   wherein the mold actuator is configured to pressurize the molding material in the cavity by applying a second pressure to the upper mold; and
   a controller configured to control the plunger actuator to reduce the first pressure applied to the plunger after the mold actuator begins applying the second pressure to the upper mold.

2. The molding apparatus of claim 1, wherein:
   the port is disposed on a sidewall of the chamber in a first direction, and the port is configured to discharge the molding material in a second direction perpendicular to the first direction.

3. The molding apparatus of claim 1, wherein:
   the controller is configured to control the mold actuator to apply the second pressure to the upper mold after the molding material covers the plurality of molding targets arranged at a farthest distance from the port.

4. The molding apparatus of claim 3, wherein:
   the controller is configured to control the mold actuator to apply the second pressure to the upper mold before the entire top surface of the substrate is covered with the molding material.

5. The molding apparatus of claim 1, wherein the first pressure is equal to or less than 5 MPa.

6. The molding apparatus of claim 1, wherein the second pressure is higher than the first pressure.

7. The molding apparatus of claim 1, further comprising:
   a vent hole formed in a sidewall of the chamber, so that the vent hole is opposite the port; and
   a gas pump configured to suck or discharge air through the vent hole.

8. The molding apparatus of claim 7, wherein:
   the controller is configured to control the gas pump to suck the air through the vent hole before the plunger actuator applies the first pressure to the plunger.

9. The molding apparatus of claim 7, wherein:
   the controller is configured to control the gas pump to supply the air through the vent hole after the mold actuator applies the second pressure to the upper mold.

10. A molding apparatus of a semiconductor package, the molding apparatus comprising:
    a cylindrical chamber comprising a lower mold configured to hold a substrate comprising a plurality of molding targets, and an upper mold configured to move up and down with respect to the lower mold and define a cavity between the upper mold and the lower mold;
    a first port formed on an inner sidewall of the chamber and configured to provide a passage communicating with the cavity;
    a second port formed in a top portion of the chamber and configured to provide a passage communicating with the cavity;
    a molding material supplier configured to supply a molding material to the second port;
    a plunger configured to pressurize the molding material inside the second port;
    a plunger actuator configured to apply a first pressure to the plunger such that the molding material provided in the second port is supplied to the cavity; and
    a mold actuator configured to control actuation of the upper mold,
    wherein the mold actuator is configured to pressurize the molding material in the cavity by applying a second pressure to the upper mold.

11. The molding apparatus of claim 10, wherein:
the second port is aligned at a center of the substrate in a vertical direction, and the second port is configured to discharge the molding material toward the substrate.

12. The molding apparatus of claim 10, further comprising:
a controller configured to control the mold actuator to apply the second pressure to the upper mold after the molding material covers the plurality of molding targets arranged at a farthest distance from a center of the substrate.

13. The molding apparatus of claim 10, wherein:
the upper mold includes a hole to which the second port is coupled in a center of a circular cross-section.

14. The molding apparatus of claim 13, wherein:
the second port extends in a vertical direction through the hole inside the upper mold.

15. The molding apparatus of claim 10, wherein:
the first pressure is equal to or less than 5 MPa, and the second pressure is higher than the first pressure.

16. The molding apparatus of claim 10, wherein:
the second port is configured to discharge the molding material toward a center of the substrate.

17. The molding apparatus of claim 10, further comprising:
a vent hole formed in a sidewall of the chamber to face the first port; and
a gas pump configured to suck or discharge air through the vent hole.

18. The molding apparatus of claim 17, further comprising:
a controller configured to control the gas pump to suck the air through the vent hole before the plunger actuator applies the first pressure to the plunger, and to supply the air through the vent hole after the mold actuator applies the second pressure to the upper mold.

19. A molding apparatus of a semiconductor package, the molding apparatus comprising:
a chamber comprising a lower mold configured to hold a substrate comprising a plurality of molding targets, and an upper mold configured to raise and lower with respect to the lower mold and define a cavity between the upper mold and the lower mold;
a port formed on a sidewall of the chamber in a first direction, configured to provide a passage communicating with the cavity, and discharge a molding material to the cavity in a second direction perpendicular to the first direction;
a molding material supplier configured to supply a molding material to the port;
a plunger configured to pressurize the molding material inside the port;
a plunger actuator configured to apply a first pressure to the plunger such that the molding material provided in the port is supplied to the cavity; and
a mold actuator configured to control actuation of the upper mold;
wherein:
the plunger actuator is configured to supply the molding material to the cavity by applying a first pressure equal to or less than 5 MPa to the plunger,
the mold actuator is configured to pressurize the molding material in the cavity by applying a second pressure higher than the first pressure to the upper mold,
and further comprising:
a controller configured to:
control the mold actuator to apply the first pressure to the plunger and apply the second pressure to the upper mold after the molding material molds the plurality of molding targets arranged at a farthest distance from the port, and
control the plunger actuator to reduce the first pressure applied to the plunger after the mold actuator begins applying the second pressure to the upper mold.

20. The molding apparatus of claim 19, further comprising:
a vent hole formed in a sidewall of the chamber to face the port; and
a gas pump configured to suck or discharge air through the vent hole
wherein the controller is further configured to control the gas pump to suck the air through the vent hole before the plunger actuator applies the first pressure to the plunger, and to supply the air through the vent hole after the mold actuator applies the second pressure to the upper mold.

* * * * *